US005774413A

United States Patent [19]
Hunt

[11] Patent Number: 5,774,413
[45] Date of Patent: Jun. 30, 1998

[54] SENSED WORDLINE DRIVER

[75] Inventor: Jeffery Scott Hunt, Ackerman, Miss.

[73] Assignee: Cypress Semiconductor Corporation, San Jose, Calif.

[21] Appl. No.: 764,329

[22] Filed: Dec. 12, 1996

[51] Int. Cl.$^6$ ..................................... G11C 8/00
[52] U.S. Cl. ................. 365/230.06; 365/230.03
[58] Field of Search .................. 365/230.03, 230.06, 365/230.08; 326/105–108

[56]  References Cited

U.S. PATENT DOCUMENTS

| | | | |
|---|---|---|---|
| 4,747,083 | 5/1988 | Nakajima | 365/230.06 |
| 5,222,047 | 6/1993 | Matsuda et al. | 365/230.03 |
| 5,241,510 | 8/1993 | Kobayashi et al. | 365/230.03 |
| 5,369,619 | 11/1994 | Ohba | 365/230.03 |

*Primary Examiner*—David C. Nelms
*Assistant Examiner*—Son Mai
*Attorney, Agent, or Firm*—Bliss McGlynn, P.C.

[57]  ABSTRACT

The present invention concerns a method and apparatus for generating a global wordline signal without requiring a metal layer for the global wordline route across multiple arrays. The global wordline signal is generally cascaded between the various group arrays. A low voltage level is generally presented across the wordlines to the various arrays that are inactive to minimize the overall amount of current used by the circuit. Once a particular array is activated, the present invention boosts the signal to a high level which represents an active wordline for a selected array. The present invention uses a global wordline scheme that uses the local wordlines from the previous array to determine whether to bring the next array up to an active level.

19 Claims, 3 Drawing Sheets

SENSED WORDLINE DRIVER

FIELD OF THE INVENTION

The present invention relates to memory arrays generally and, more particularly, to a global/local wordline scheme implemented without the use of a global route across arrays.

BACKGROUND OF THE INVENTION

Previous approaches for implementing a global/local wordline driver may employ a layer of metal (e.g., metal2) to route a global wordline across the memory arrays and connect to the local wordline drivers.

Referring to FIG. 1, a circuit 10 implementing a previous approach implementation of a global/local wordline driver is shown. A circuit 10 generally comprises a row decoder 12, a group array 14a and a group array 14n. The row decoder 12 generally presents a signal at an output 16 through an inverter 18. The inverter 18 acts as a global wordline driver. The output of the inverter 18 presents a signal GLOBAL_WL that is presented to an input 22 of a NOR gate 24. The signal GLOBAL_WL is also presented to an input 32 of a NOR gate 30. An input 26 of the NOR gate 24 generally receives a signal GRPSEL_0. The output of the gate 24 presents a signal LOCAL_WL0 to the input 20. A NOR gate 30 generally receives a signal GLOBAL_WL at an input 32 and a signal GRPSEL_N at an input 34. The gate 30 generally presents a signal LOCAL_WLN to an input 36 of the group array 14n. The output 16 is presented to the inverter 18 to generate a signal GLOBAL_WL that is used to control a particular wordline of the circuit 10. A number of wordlines may be implemented that would each generally require a signal similar to GLOBAL_WL to enable a wordline in the selected array.

The row decoder 12 decodes a row address and presents an input to the inverter 18 which presents the global wordline signal GLOBAL_WL. The global wordline signal GLOBAL_WL is generally routed across all the arrays and connects to an input of the NOR gates 24 and 30. The NOR gates 24 and 30 generally convert the global wordline signal GLOBAL_WL to local wordline signals LOCAL_WL0 and LOCAL_WLN. The active driver is generally selected by an active group select signal GRPSEL_0~N. The circuit 10 generally takes advantage of multiple metal layers to route the global wordline signal GLOBAL_WL across each of the arrays 14a~14n for each of the wordlines.

It is desirable for certain applications to create a global wordline signal without the necessity of a multiple metal layer process. Without the multiple metal layers, the ability to route a metal layer across the various arrays 14a~14n is not practical if metal routing exists perpendicular to the wordline routing.

SUMMARY OF THE INVENTION

The present invention concerns a method and apparatus for generating a global wordline signal without requiring a metal layer for the global wordline route across multiple arrays. The global wordline signal is generally cascaded between the various group arrays. A low voltage level is generally presented across the wordlines to the various arrays that are inactive to minimize the overall amount of current used by the circuit. Once a particular array is activated, the present invention boosts the signal to a high level which represents an active wordline for a selected array. The present invention uses a global wordline scheme that uses the local wordlines from the previous array to determine whether to bring the next array up to an active level.

The objects, features and advantages of the present invention include providing a global wordline signal using a single metal process, reducing the die size while minimizing an increase in current, limiting the number of row decoders necessary and minimizing the overall power consumption of the circuit.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
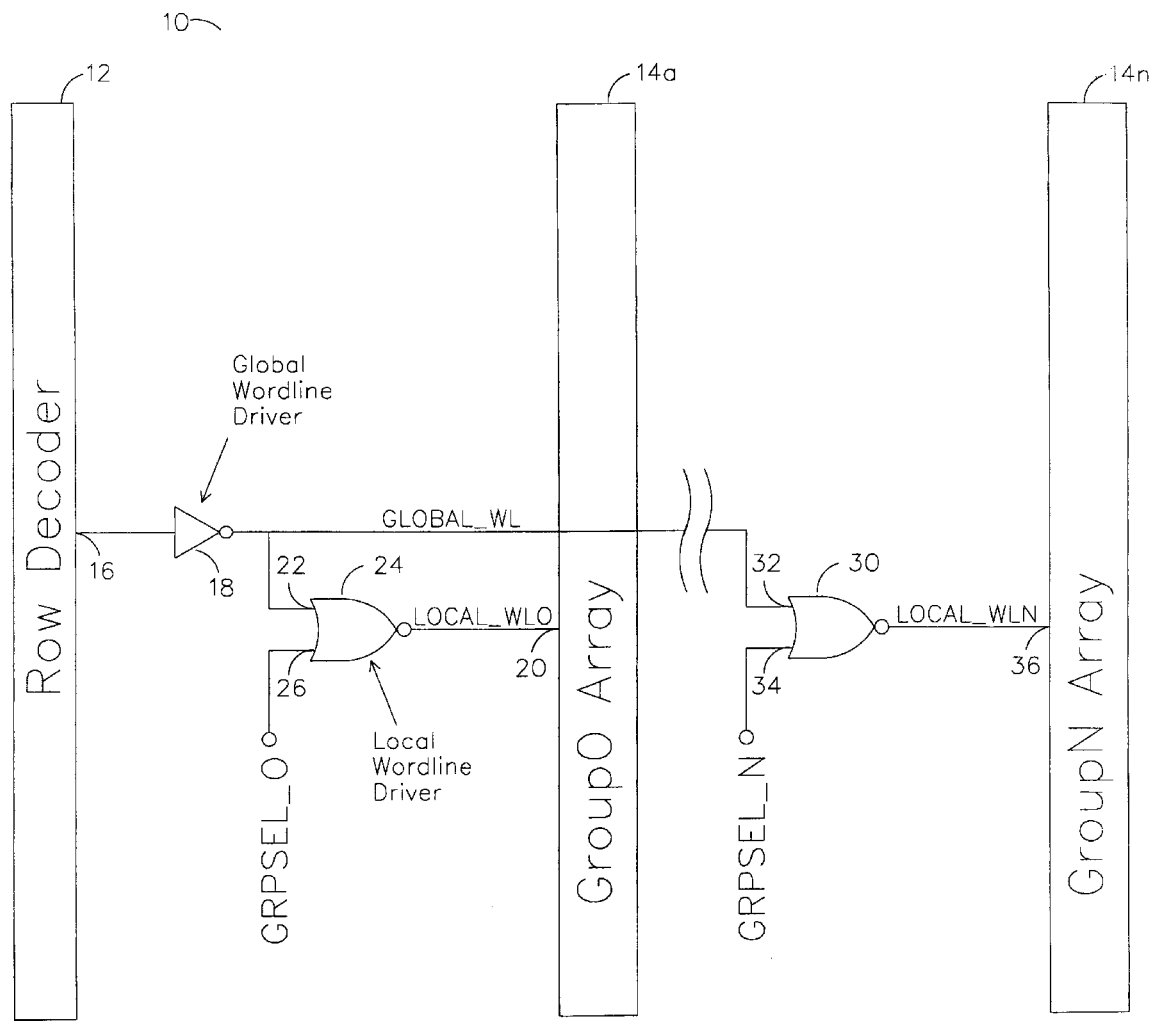
FIG. 1 is a block diagram of a previous approach global wordline signal implemented in a number of group arrays.
Figure 2:
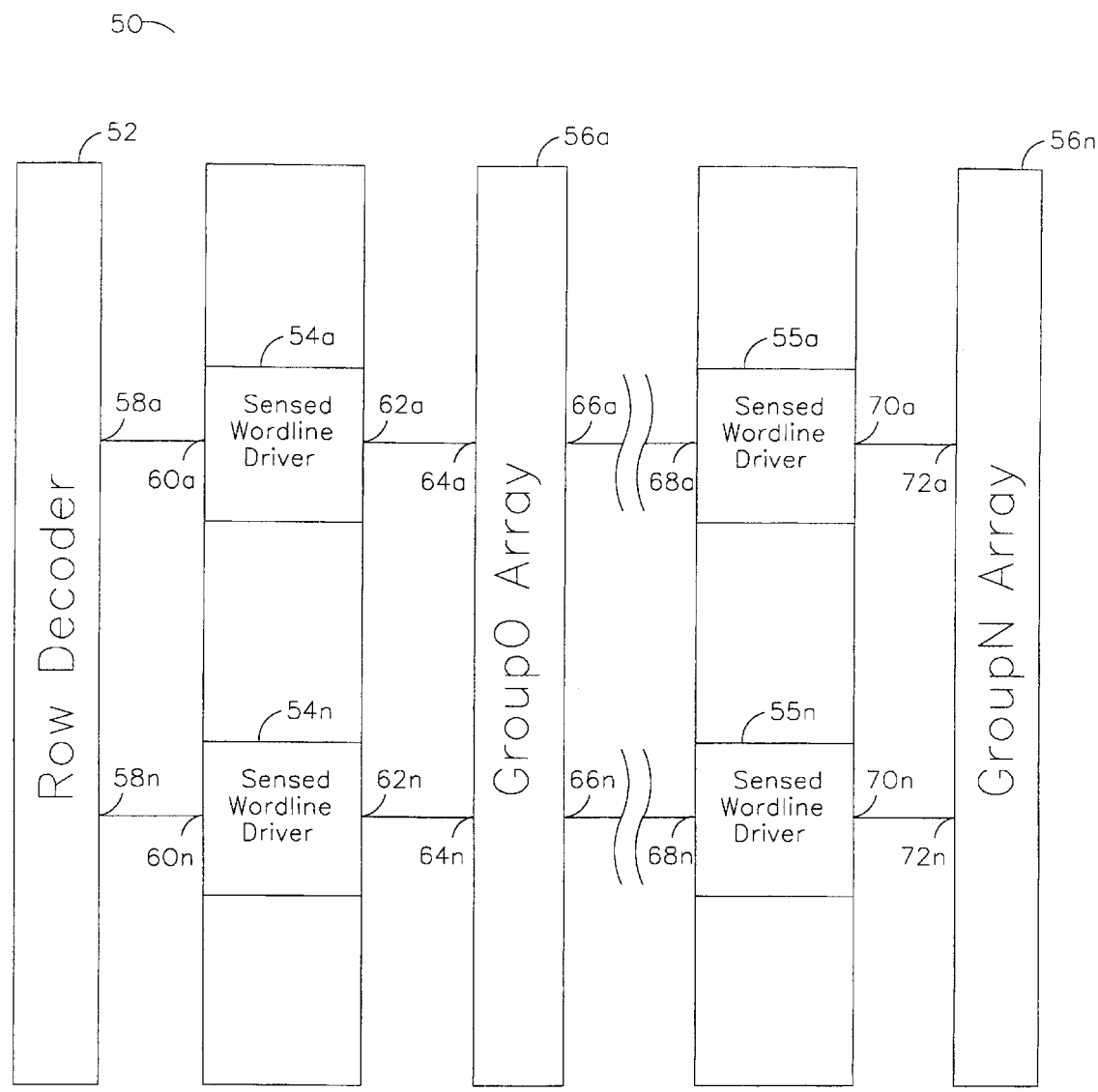
FIG. 2 is a block diagram of a preferred embodiment of the present invention.

Referring to FIG. 2, a block diagram of a circuit 50 is shown in accordance with a preferred embodiment of the present invention. The circuit 50 generally comprises a row decoder 52, a number of sensed wordline drivers 54a~54n, a number of sensed wordline drivers 55a~55n and a number of group arrays 56a~56n. The row decoder 52 presents a number of signals at a number of outputs 58a~58n that are generally received at a number of inputs 60a~60n of the sensed wordline drivers 54a~54n. The sensed wordline drivers 54a~54n generally present a number of signals at a number of outputs 62a~62n that are generally received at a number of inputs 64a~64n of the group array 56a. The particular decode signal received at one of the inputs 64a~64n generally activates a particular wordline of the group array 56a. The group array 56a presents a signal at one of a number of outputs 66a~66n that is generally received at one of a number of inputs 68a~68n of the sensed wordline drivers 55a~55n. The sensed wordline drivers 55a~55n generally present a signal at one of a number of outputs 70a~70n that is generally received at one of a number of inputs 72a~72n of the group array 56n.

The sensed wordline driver 54a and the sensed wordline driver 55a work in combination to enable a particular wordline of the circuit 50. The sensed wordline driver 54n and the sensed wordline driver 55n work in combination to enable another particular wordline of the circuit 50. Any number of wordlines may be implemented according to the design criteria of a particular application. The row decoder 52 generally presents a signal at one of the outputs 58a~58n that enables a particular wordline. The sensed wordline drivers 54a and 55a work in combination to select which particular group array 56a~56n is enabled when a particular wordline is enabled by the row decoder 52. Similarly, the sensed wordline driver 54n and the sensed wordline driver 55n work in combination to determine which of the group arrays 56a~56n is enabled when another particular wordline is enabled. As a result, the row decoder 52 generally provides a row enabling scheme while the sensed wordline drivers 54a~54n and 55a~55n provide an array enabling scheme. The enabling scheme of the sensed wordline drivers 54a~54n and 55a~55n are described in more detail in connection with FIG. 3. The signals presented at the output, 58a~58n, 62a~62n, 66a~66n and 70a~70n each generally form a global wordline scheme.

Figure 3:
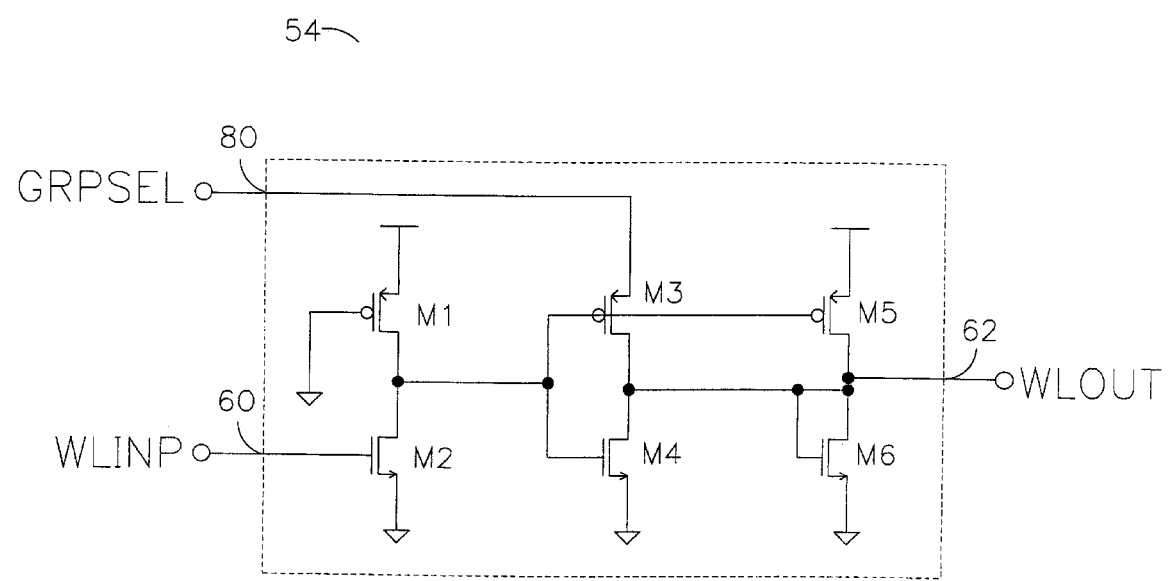
FIG. 3 is a circuit diagram of a particular sensed wordline driver.

Referring to FIG. 3, a particular sensed wordline driver 54 is shown. An input 60 represents a control signal WLINP received from the previous group array 56a~56n while the output 62 represents an enable signal WLOUT presented to the next group array 56a~56n. The input 60 and the output 62 generally correspond to the input 68 and the output 70 of the sensed wordline driver 55n. The sensed wordline driver 54 generally comprises a transistor M1, a transistor M2, a transistor M3, a transistor M4, a transistor M5 and a transistor M6.

A select signal GRPSEL is generally received at an input 80 which is coupled to the source of the transistor M3. The source of the transistor M1 is generally coupled to a supply voltage. The gate of the transistor M1 is generally coupled to ground. The drain of the transistor M1 is generally coupled to the drain of the transistor M2 to create a node N1. The gate of the transistor M2 is generally coupled to the input 60 and receives the signal WLINP. The source of the transistor M2 is generally coupled to ground. The node N1 is generally presented to the gate of the transistor M3, the gate of the transistor M5 and the gate of the transistor M4. The drain of the transistor M3 is generally coupled to the drain of the transistor M4 and creates a node N2. The source of the transistor M4 is generally coupled to ground. The node N2 is generally presented to the drain of the transistor M5, the drain of the transistor M6 and the gate of the transistor M6. The source of the transistor M5 is generally coupled to a supply voltage. The source of the transistor M6 is generally coupled to ground. The node N2 is also generally presented at the output 62 as the signal WLOUT.

The control signal WLINP may be either a first voltage V1 (e.g., a ground voltage VSS), a second voltage V2 (e.g., a threshold voltage VTN above the ground voltage VSS) or a third voltage V3 (e.g., a supply voltage VCC). The signal WLOUT is generally produced in response to the state of the input signal WLINP and the state of the group select signal GRPSEL. The signal GRPSEL is generally either a low (e.g., a "0" or VSS) or a high, (e.g., a "1" or VCC). The following TABLE 1 summarizes the output state for all of the combinations of the inputs:

TABLE 1

| WLINP | GRPSEL | WLOUT |
| --- | --- | --- |
| V1 | 0 | V1 |
| V1 | 1 | V1 |
| V2 | 0 | V2 |
| V2 | 1 | V3 |
| V3 | 0 | V2 |
| V3 | 1 | Not Allowed |

The transistor M1 and the transistor M2 generally work in combination with the signal WLINP to condition the state of the node N1. Since the gate of the transistor M1 is shown generally connected to ground, the transistor M1 generally dictates the voltage seen at the node N1 when the transistor M2 is off. When the signal WLINP causes the transistor M2 to turn on, the transistor M2 generally overpowers the transistor M1 and dictates the voltage at the node N1.

The transistors M3 and M4 generally condition the voltage at the node N2 in response to the voltage at the node N1 as well as the voltage level of the group select signal GRPSEL. Generally, the transistors M3 and M4 provide an inversion of the node N1 when the group select signal GRPSEL is active. The transistors M5 and M6 generally provide a voltage divider to set the voltage of the output WLOUT at a level slightly above a threshold voltage level.

A first condition occurs when the signal WLINP is low (e.g., a voltage V1). The low signal at the gate of the transistor M2 generally causes the node N1 to be high since the transistor M2 is off. During this condition, the transistor M1 generally conditions the voltage at the node N1. When the node N1 is high, the state of the group select signal GRPSEL does not condition the node N2 since the transistor M4 is generally on. Since the transistor M4 is on and the transistor M3 is off, the node N2 is generally pulled towards ground. As a result, the signal WLOUT matches the signal WLINP since the transistor M2 as well as the transistor M4 provide an inversion. The transistors M5 and M6 generally do not influence the output WLOUT during the first condition since they are generally off.

A second condition occurs when the signal WLINP is at a voltage level V2 (e.g., a threshold voltage VTN above the ground voltage VSS). The transistor M2 will turn on which will generally overpower the transistor M1. As a result, the node N1 will generally be pulled to a ground level (plus the slight level created by the transistor M1). Since the node N1 is at a low level, the transistors M3 and M5 generally are turned on and the transistor M4 is generally turned off. As a result, the transistor M3 generally controls the level of the node N2 is response to the group select signal GRPSEL. When the group select signal GRPSEL is a "0", the node N2 is generally controlled by the transistors M5 and M6 since neither the transistor M3 nor the transistor M4 presents a voltage at the node N2. As a result, the output WLOUT will also be at a voltage level V2, as determined by the transistors M5 and M6. When the signal GRPSEL is a "1", the transistor M3 continues to be on, and presents the high voltage level from the group select signal GRPSEL to the node N2. As a result, the output signal WLOUT is generally at the voltage V3. When the transistor M3 is on and the transistor M6 is on, the transistor M3 generally overpowers the transistor M6.

A third condition occurs when the signal WLINP is at the voltage level V3. The transistor M2 is generally on which causes the node N1 to be pulled low. As a result, the transistor M3 and the transistor M5 will generally be on. An indication that the previous memory array was on occurs when the signal WLINP is at the voltage level V3. As a result, the present memory array may not generally be on at the same time due to the design of the wordline driver 54. Either the signal WLINP or the signal WLOUT is generally at the voltage level V3, but not both signals. In certain design applications, more than one group array 56a–n may be activated in combination to form an active group. In such a case, one or more signals WLINP may be activated at the same time to generally function as a single active group array 56a–n. The voltage at the output signal WLOUT will be the voltage level V2 when the signal WLINP is at the V3 level.

Generally, when the signal GRPSEL is a "0", the transistors M1, M2, M3 generally do not affect the output WLOUT. (When the input is also a "0"). In an alternate implementation, the transistor M3 may be sized such that it becomes part of the resistor divider created by the transistors M5 and M6. However, the sizing of the transistor M3 may be such that it does not affect the sizing of the transistors M5 and M6.

Generally, the transistor M2 will overpower the transistor M1. The transistors M5 and M6 are sized to create the threshold value at the output WLOUT. The transistor M3 is sized such that when it is on it overpowers the transistor M6. When the transistor M3 is not on, the transistor M6 is strong enough to overpower the transistor M5. When the transistor M3 is on, it is strong enough to overpower the transistor M6. The transistor M4 generally provides the function of preventing the wordline from consuming current when a wordline is disabled.

Generally only one group array 56a~56n has an active wordline. Receiving a voltage V3 at the input signal WLINP input generally indicates that the previous group array 56a~56n was on. When the previous group is on, the next group generally may not also be on.

The transistor M2 is relatively larger than the transistor M1. The transistor M3 and the transistor M4 are relatively larger than the transistor M5 and the transistor M6.

The transistors M1, M3 and M5 are shown generally as PMOS transistors. The transistors M2, M4 and M6 are generally shown as NMOS transistors. The transistors M1~M6 may be implemented as any transistors necessary to meet the design criteria of a particular application.

The present invention saves current and die size by using the sensed wordline drivers 54a~54n and 55a~55n without requiring an additional metal layer for a global wordline route. Generally, only one group array 56a~56n is turned on, and in a powered state, at a time. The other group arrays 56a~56n are generally in a very weakened state, thus reducing overall current consumption. This allows for the savings of a significant amount of die size.

Generally, the more row decoders 52 that are implemented in a circuit 50, the less current that is consumed. However, the more row decoders that are implemented also correspondingly increases the amount of die size. The present invention utilizes a single row decoder 52, while also maintaining a low overall current consumption by turning off the group arrays 56a~56n that are not presently active, without the implementation of an additional metal layer for a global wordline route.

The voltage necessary to sense a particular condition by the sense wordline drivers 54 may be as low as a threshold voltage VTN. However, the lower the voltage, the more difficult it will be to sense a particular condition. As a result, a balance between a higher voltage level and the amount of current consumed must be made. A slightly higher voltage results in the ability of the sense wordline driver 54 to sense a particular condition at the expense of a slightly increased current.

While the invention has been particularly shown and described with reference to the preferred embodiments thereof, it will be understood by those skilled in the art that various changes in form and details may be made without departing from the spirit and scope of the invention.

I claim:

1. A circuit comprising:
a plurality of wordline drivers, wherein a first one of said wordline drivers is configured to: (i) receive a control signal, (ii) receive a select signal and (iii) present an enable signal; and
a plurality of group arrays, each configured to turn on in response to said enable signal and said control signal, and a first one of which is configured to present a second control signal to a next one of said wordline drivers, wherein only one of said group arrays is on at a time.

2. The circuit according to claim 1 wherein said next wordline driver presents a second enable signal to a next one of said group arrays in response to said second control signal and a second select signal.

3. The circuit according to claim 1 wherein said plurality of wordline drivers are alternately connected between said one or more group arrays.

4. The circuit according to claim 1 wherein said control signal further comprises a group decode signal.

5. The circuit according to claim 1 wherein said enable signal further comprises a global wordline enable signal.

6. The circuit according to claim 1 wherein said select signal further comprises a group select signal.

7. The circuit according to claim 2 wherein the output of one of said wordline drivers is presented as an input of the next wordline driver.

8. The circuit according to claim 1 further comprising a decoder circuit configured to present said control signals.

9. The circuit according to claim 1 further comprising a decoder circuit configured to present said control signals.

10. The circuit according to claim 1, wherein
said control signal has a first voltage level, a second voltage level or a third voltage level;
said enable signal has said first voltage level, said second voltage level or said third voltage level; and
said second control signal has said first voltage level, said second voltage level or said third voltage level.

11. A method for presenting a global wordline signal comprising the steps of:
generating an enable signal in response to: (i) a control signal having a first voltage level, a second voltage level or a third voltage level and (ii) a select signal; and
turning on only one group array out of a plurality of group arrays in response to said first voltage level of said enable signal; and
presenting a second control signal to a next one of said wordline drivers, said second control signal having said first voltage level, said second voltage level or said third voltage level.

12. The method according to claim 11 further comprising the step of:
generating a second enable signal having said first voltage level, said second voltage level or said third voltage level in response to: (i) said enable signal and (ii) a second select signal.

13. The method according to claim 12 further comprising the step of:
connecting a plurality of said group arrays, wherein one of said group arrays is on at a time.

14. The method according to claim 11 wherein said enable signal comprises a global wordline signal.

15. A circuit comprising:
a plurality of wordline drivers, wherein a first one of said wordline drivers is configured to: (i) receive a control signal having a first voltage level, a second voltage level or a third voltage level, (ii) receive a select signal and (iii) present an enable signal having said first voltage level, said second voltage level or said third voltage level; and
a plurality of group arrays, wherein a first one of said group arrays is configured to: (i) turn on in response to said first level of said enable signal and (ii) present a second control signal to a next one of said wordline drivers, said second control signal having said first voltage level, said second voltage level or said third voltage level.

16. The circuit according to claim 15 wherein said next wordline driver presents a second enable signal having said first voltage level, said second voltage level or said third voltage level to a next one of said group arrays in response to said second control signal and a second select signal.

17. The circuit according to claim 16 wherein the output of one of said wordline drivers is presented as an input of the next wordline driver.

18. The circuit according to claim 15, wherein only one of said group arrays is on at a time.

19. The circuit according to claim 15, wherein one of said first voltage level, said second voltage level and said third voltage level comprises a threshold voltage above ground sufficient to be sensed by said next one of said wordline drives.

* * * * *